(12) United States Patent
Matsueda et al.

(10) Patent No.: US 6,887,100 B2
(45) Date of Patent: May 3, 2005

(54) ELECTRO-OPTICAL APPARATUS, MATRIX SUBSTRATE, AND ELECTRONIC UNIT

(75) Inventors: Yojiro Matsueda, Chino (JP); Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/637,638

(22) Filed: Aug. 11, 2003

(65) Prior Publication Data

US 2004/0115989 A1 Jun. 17, 2004

(30) Foreign Application Priority Data

Sep. 25, 2002 (JP) .......................... 2002-278970
Aug. 4, 2003 (JP) .......................... 2003-286292

(51) Int. Cl.⁷ .......................................... H01R 33/945
(52) U.S. Cl. .................................................. 439/577
(58) Field of Search ........................ 439/577, 638–640, 439/247–284

(56) References Cited

U.S. PATENT DOCUMENTS 4,432,604 A * 2/1984 Schwab ...................... 385/60
5,239,983 A * 8/1993 Katsurada .................... 600/178
2003/0045164 A1 * 3/2003 Echigo et al. ............... 439/577

FOREIGN PATENT DOCUMENTS

JP        A-11-24606        1/1999

* cited by examiner

*Primary Examiner*—Jean F. Duverne
(74) *Attorney, Agent, or Firm*—Oliff & Berridge, PLC

(57) ABSTRACT

The invention provides an electro-optical apparatus having a power-supply wiring structure that is capable of supplying a sufficient electrical power to a common electrode of electro-optical devices. An electro-optical apparatus according to the present invention includes electro-optical devices having a laminated structure including first electrode layers formed on or above a viewing area of a substrate and a second electrode layer formed on or above the first electrode layers. The laminated structure further includes first power lines to supply a voltage to the first electrode layers and second power wiring electrically connected to the second electrode layer. The first power lines and the second power lines are arranged on or above the viewing area and are arranged in the same layer as the first electrode layers or below the first electrode layers.

24 Claims, 9 Drawing Sheets

ELECTRO-OPTICAL APPARATUS, MATRIX SUBSTRATE, AND ELECTRONIC UNIT

BACKGROUND OF THE INVENTION

1. Field of Invention

The present invention relates to the structure of power-supply wiring suitable for an electro-optical apparatus having electro-optical devices.

2. Description of Related Art

Organic electroluminescent (EL) devices, which are current-driven spontaneous light-emitting devices, have the advantages of requiring no backlight, low power consumption, wide viewing angle, and high contrast, and thus may be usable for flat-panel displays. Organic EL devices are electro-optical devices in which a light-emitting layer having a fluorescent material is interposed between an anode and a cathode. Providing a forward-biased current between both electrodes causes positive holes injected from the anode and electrons injected from the cathode to recombine. By the resultant recombination energy, the organic EL device emits light. In other words, in order to cause light emission in the organic EL device, it is necessary to supply power from an external circuit. Related art active-matrix-addressing-type organic EL display panels use such a structure, that is, a pixel electrode, as the anode, is disposed for each pixel in a pixel area and a common electrode, as the cathode, covers the entire pixel area. Japanese Unexamined Patent Application Publication No. 11-24606, for example, discloses a display device with reduced power consumption and enhanced luminous efficiency by enhancing or optimizing the wiring layout.

SUMMARY OF THE INVENTION

The wiring resistance of the common electrode is an issue in realizing a display panel using the electro-optical devices. Specifically, a higher wiring resistance of the common electrode leads to an increased voltage drop in pixels in the center of the screen, thereby failing to supply sufficient current to the central part of the screen. As a consequence, a gray-scale is not displayed accurately and display performance decreases. This matter may become a serious problem in a larger display panel because the wiring resistance of the common electrode becomes higher. Decreasing the resistance of the common electrode is a problem to be solved especially in a so-called top-emission structure, in which light is emitted from the side of a transparent cathode, since the related art does not include a material that has the same level of low resistance as a metal layer and that is also suitable for a light-transmitting electrode.

Accordingly, the present invention provides an electro-optical apparatus and a matrix substrate having a structure for power-supply wiring that is capable of providing a sufficient power to a common electrode of electro-optical devices. Moreover, the present invention provides an electro-optical apparatus and a matrix substrate that are capable of reducing the width of a display panel frame.

An electro-optical apparatus according to the present invention includes electro-optical devices having a laminated structure including first electrode layers formed on or above a viewing area of a substrate and a second electrode layer formed on or above the first electrode layers. The laminated structure further includes first power lines to supply a voltage to the first electrode layers, and second power lines electrically connected to the second electrode layer. The first power lines and the second power lines are arranged on or above the viewing area and are arranged in the same layer as the first electrode layers or below the first electrode layers.

As described above, the second power lines electrically connected to the second electrode layer are formed in any layer of the laminated structures formed above the viewing area of the substrate so that sufficient electric power is supplied even if the second electrode layer show high resistance. Furthermore, joints electrically connecting the second electrode layer with the second power lines are included within the laminated structures, thus reducing the width of a display panel frame.

The term "the electro-optical devices" means general electronic devices that change optical states of light by electrical operations and include a self-luminous device, such as an electroluminescent device and an electronic device displaying a gray-scale by varying a state of deflection of light, such as a liquid crystal device. "The viewing area" means an area in the substrate used for electro-optical displays, i.e., an area in which the electro-optical devices are formed and is equivalent to "a display area" of exemplary embodiments in the present invention. "The laminated structures" mean laminated structures including various thin films laminated on or above the substrate and include not only device layers including the electro-optical devices but also an insulating interlayer film, the electrode layers, the power lines, and the like. Electronic devices, such as a transistor, may lie between the first electrode layers and the first power lines in the invention. The first power lines and the second power lines may be formed in the same layer for the sake of convenience in the manufacturing process or may be formed in different layers.

In the electro-optical apparatus according to the present invention, preferably, the first power lines and the second power lines are disposed in the same layer at least partially, thus simplifying the manufacturing process.

In the electro-optical apparatus according to the present invention, preferably, the second electrode layer functions as a cathode for the electro-optical devices. The second electrode layer functioning as the cathode allows a reduction in resistance of the cathode in the electro-optical devices.

In the electro-optical apparatus according to the present invention, preferably, the second power lines function as auxiliary cathode lines. Thereby, a sufficient electrical power is supplied to the cathode in the electro-optical devices.

In the electro-optical apparatus according to the present invention, preferably, the second electrode layer has light transmission. Thereby, a top-emission structure in which light is emitted through the second electrode layer is achieved, thus increasing an aperture ratio.

In the electro-optical apparatus according to the present invention, preferably, the second power lines are formed linearly in any one of layers of the laminated structure at a predetermined density. Distributing the second power lines at the predetermined density allows a reduction in resistance of the second electrode layer.

In the electro-optical apparatus according to the present invention, preferably, the second power lines and the second electrode layer are formed in different layers of the laminated structure and are electrically connected to each other within the laminated structure. Positions where the second power lines are electrically connected to the second electrode layer are disposed within the laminated structures, thus reducing the width of a display panel frame.

In the electro-optical apparatus according to the present invention, preferably, positions where the second power lines are electrically connected to the second electrode layer are disposed along the direction in which the second power lines extend at multiple positions. The second power lines and the second electrode layer are electrically connected at the multiple positions so that a reduction in resistance of the second electrode layer is achieved.

In the electro-optical apparatus according to the present invention, preferably, the second power lines and the second electrode layer are formed in different layers with an insulating interlayer film disposed therebetween and are electrically connected to each other through contact holes formed in the insulating interlayer film. The second power lines and the second electrode layer are formed in different layers of the laminated structure so that manufacturing processes thereof are separated.

In the electro-optical apparatus according to the present invention, preferably, the electro-optical devices are arranged in two substantially orthogonal directions, and the second power lines are arranged in a direction substantially along the direction in which either direction of the two orthogonal directions in which the electro-optical devices are arranged. The direction of arranging the second power lines is along the direction in which the direction of arranging the electro-optical devices so that sufficient electrical power is supplied to the second electrode layer of the electro-optical devices arranged in the two orthogonal directions.

In the electro-optical apparatus according to the present invention, preferably, the second power lines are disposed at substantially equal pitch. The second power lines are equally spaced so that electrical power is uniformly supplied to each of the electro-optical devices disposed in the two orthogonal directions.

In the electro-optical apparatus according to the present invention, preferably, the electro-optical devices are electroluminescent devices. The electroluminescent device is used so that a luminance gray-scale is adjusted by a driving current.

An electronic unit according to the present invention includes the above-described electro-optical apparatus. The electronic unit may be of any type as long as it includes a display apparatus. The electronic unit may be a mobile phone, a video camera, a personal computer, a head-mounted display, a projector, a facsimile machine, a digital camera, a mobile television, a DSP apparatus, a PDA, or an electronic notepad, for example.

A matrix substrate according to the present invention forms electro-optical devices having a laminated structure that includes first electrode layers and a second electrode layer. The matrix substrate includes a substrate, the first electrode layers formed on or above the substrate; first power lines to supply a voltage to the first electrode layers; and second power lines electrically connected to the second electrode layer to be formed on or above the first electrode layers. Both of the first power lines and the second power lines are arranged on or above the viewing area and are arranged in the same layer as the first electrode layers or below the first electrode layers.

As described above, the second power lines are electrically connected to the second electrode layer in either layer of the laminated structure of the electro-optical devices to be laminated on or above the viewing area of the substrate so that sufficient electric current is supplied to each of the electro-optical devices even if the second electrode layer shows high resistance. Furthermore, positions where the second power lines are electrically connected to the second electrode layer are disposed within the laminated structures, thus reducing the width of a display panel frame. The term "matrix substrate", as used in here, means a wiring substrate in which the electro-optical devices have not been formed.

In the matrix substrate according to the present invention, preferably, the first power lines and the second power lines are disposed in the same layer at least partially, thus simplifying the manufacturing process.

In the matrix substrate according to the present invention, preferably, the second electrode layer functions as a cathode for the electro-optical devices, thus reducing resistance of the cathode of the electro-optical devices.

In the matrix substrate according to the present invention, preferably, the second power lines function as auxiliary cathode wiring, thereby supplying sufficient electrical power to the cathode of the electro-optical devices.

In the matrix substrate according to the present invention, preferably, the second electrode layer has light transmission. Thereby, a top-emission structure in which light is emitted from the second electrode layer is achieved, thus raising an aperture ratio.

In the matrix substrate according to the present invention, preferably, the second power lines are formed linearly in any one of layers of the laminated structure at a predetermined density. Distributing the second power lines at the predetermined density allows a reduction in resistance of the second electrode layer.

In the matrix substrate according to the present invention, preferably, the second power lines and the second electrode layer are formed in different layers of the laminated structure and are electrically connected to each other within the laminated structure. Positions where the second power lines are electrically connected to the second electrode layer are disposed within the laminated structures, thus reducing the width of a display panel frame.

In the matrix substrate according to the present invention, preferably, the second power lines are electrically connected to the second electrode layer are disposed along the direction in which the second power lines extend at multiple positions. The second power lines and the second electrode layer are electrically connected at the multiple positions so that a reduction in resistance of the second electrode layer is achieved.

In the matrix substrate according to the present invention, preferably, the second power lines and the second electrode layer are formed in different layers with an insulating interlayer film disposed therebetween, and the second power lines and the second electrode layer are electrically connected to each other through contact holes formed in the insulating interlayer film. The second power lines and the second electrode layer are formed in different layers of the laminated structure so that manufacturing processes thereof are separated.

In the matrix substrate according to the present invention, preferably, the electro-optical devices are arranged in two substantially orthogonal directions, and the second power lines are arranged in a direction substantially along the direction in which either direction of the two orthogonal directions in which the electro-optical devices are arranged. The direction of arranging the second power lines is along the direction in which the direction of arranging the electro-optical devices so that sufficient electrical power is supplied to the second electrode layer of the electro-optical devices arranged in the two orthogonal directions.

In the matrix substrate according to the present invention, preferably, the second power lines are disposed at substantially equal pitch. The second power lines are equally spaced so that electrical power is uniformly supplied to each of the electro-optical devices disposed in the two orthogonal directions.

DETAILED DESCRIPTION OF PREFERRED EMBODIMENTS

[First Exemplary Embodiment]

The exemplary embodiment is illustrated below with reference to the drawings.

Figure 1:
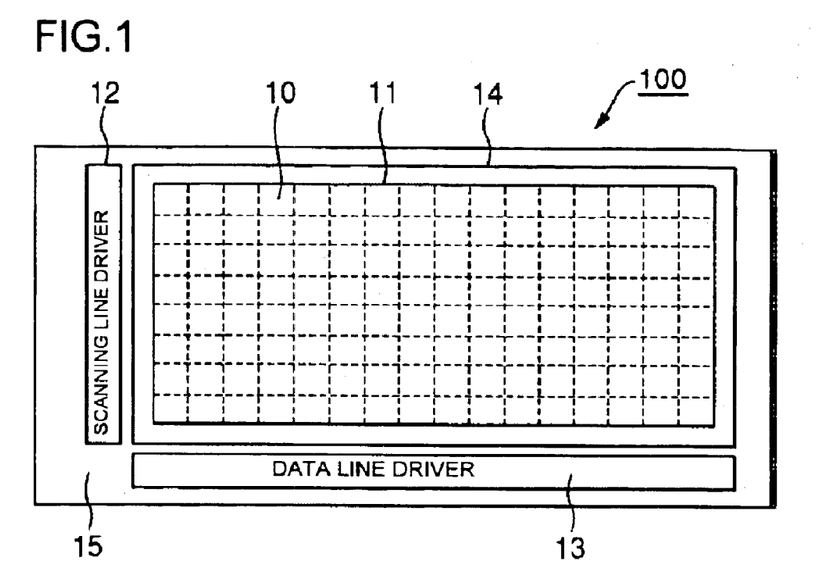
FIG. 1 is a schematic of an organic EL display panel of the present invention.

FIG. 1 is a schematic of an active-matrix-type organic EL display panel 100 of the exemplary embodiment. As illustrated in FIG. 1, a plurality of pixels 10, a scanning line driver 12, and a data line driver 13 are disposed on or above a substrate 15. The plurality of pixels 10 have laminated structures disposed on a display area 11. The scanning line driver 12 outputs scanning signals to scanning lines, which are disposed in a row direction and connected to a group of the pixels 10. The data line driver 13 supplies data signals and power supply voltages to data lines and power supply lines, respectively. The data lines and the power supply lines are disposed in a column direction and connected to a group of the pixels 10. The pixels 10 form an N-row, M-column pixel matrix, in which the row direction and the column direction are disposed orthogonally and form a pixel matrix. Each of the pixels 10 includes an organic EL device emitting light with red, green, and blue (RGB), the three primary colors. The entire surface of the laminated structure disposed on the display area 11 is covered with a film of a cathode 14 which serves as a common electrode. The cathode 14 is preferably made of a material that is capable of injecting as many electrons as possible, i.e., a material having a low work function. Preferably, such a conductive material is a thin metal film made of calcium, lithium, or aluminum.

The organic EL display panel 100 has a bottom-emission structure that emits light through the substrate 15. However, the present invention is not limited to this structure. The organic EL display panel 100 may have a so-called top-emission structure that emits light through the cathode 14 if the cathode 14 is a light-transmitting conductive film. In the organic EL display panel 100 having the top-emission structure, the cathode 14 may be formed of a semitransparent conductive metal layer obtained by processing a thin metal film such as a calcium, lithium, or aluminum film to be thin so as to be able to transmit a light, in addition to a light-transmitting conductive material such as an indium tin oxide (ITO). Such a semitransparent conductive metal layer allows the cathode 14 to have low resistance.

Figure 2:
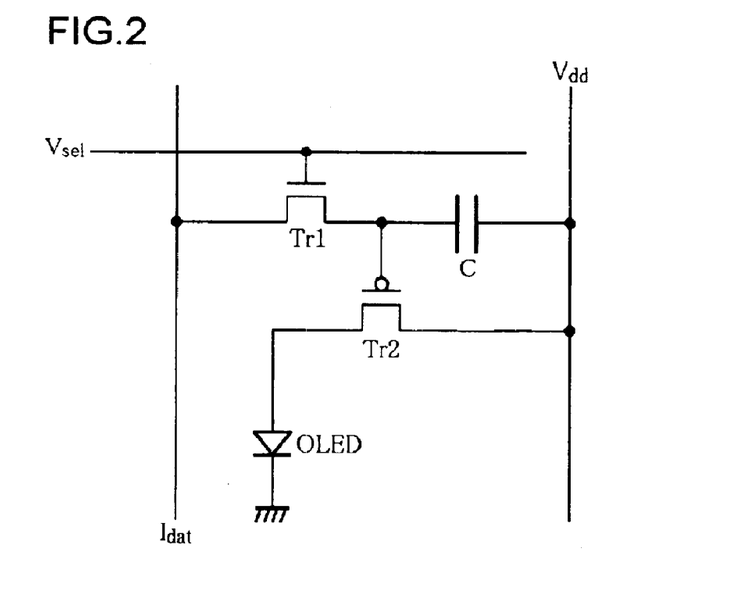
FIG. 2 is a schematic of a main pixel circuit.

FIG. 2 shows a main circuit of one of the pixels 10. The pixel 10 includes a switching transistor Tr1, a driving transistor Tr2, a storage capacitor C, and a light-emitting section OLED. The two transistors control the driving of the pixel 10. The switching transistor Tr1 is an n-channel FET, in which the gate terminal is connected to a scanning line $V_{sel}$ and the drain terminal is connected to a data line $I_{dat}$. The driving transistor Tr2 is a p-channel FET, in which the gate terminal is connected to the source terminal of the switching transistor Tr1. In the driving transistor Tr2, the source terminal is connected to a power supply line $V_{dd}$ and the drain terminal is connected to the light-emitting section OLED. The storage capacitor C is provided between the gate terminal and the source terminal of the driving transistor Tr2. In the above-described arrangement, when a selection signal is output to the scanning line $V_{sel}$ and when the switching transistor Tr1 is opened, a data signal supplied over the data line $I_{dat}$ is written in the storage capacitor C as a voltage. The written voltage in the storage capacitor C is then stored during one frame period, changing a conductance of the driving transistor Tr2 in an analog fashion and providing a forward-biased current corresponding to a luminance gray-scale to the light-emitting section OLED.

Figure 3:
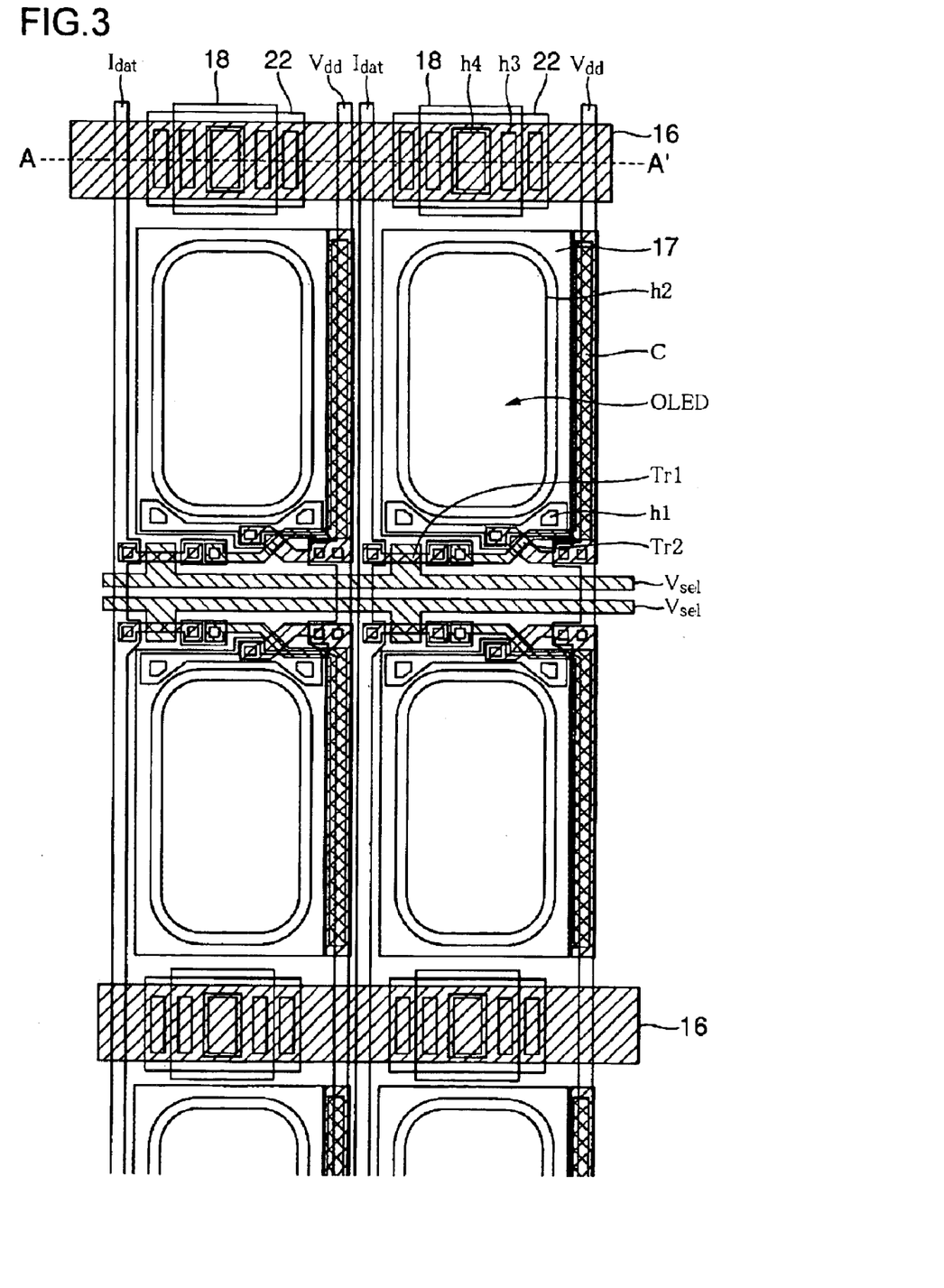
FIG. 3 is a schematic that shows a layout of wiring of the first exemplary embodiment of the present invention.

FIG. 3 illustrates the wiring layout in a pixel area. In order to decrease resistance of the cathode 14, in the present invention, fine auxiliary cathode wiring 16 is formed in a layer different from the wide cathode 14 covering the upper surface of the laminated structure laminated on the display area 11. The cathode 14 is electrically connected to the auxiliary cathode wiring 16 with an insulating interlayer film disposed therebetween. The auxiliary cathode wiring 16 may be formed in any layer. However, in view of a display manufacturing process, the auxiliary cathode wiring 16 is preferably formed in the same layer as metal wiring, such as the scanning lines $V_{sel}$ in the same manufacturing process, thus simplifying the overall process and allowing low manufacturing cost. The auxiliary cathode wiring 16 that are formed in the same process as the scanning lines $V_{sel}$ may be called a gate metal layer. The auxiliary cathode wiring 16 is preferably positioned on dead spaces of the pixels 10. Since the dead spaces vary according to the layout of the pixels 10, the auxiliary cathode wiring 16 should be disposed at the most suitable position in consideration of the positions of the data lines $I_{dat}$, the scanning lines $V_{sel}$, power supply lines $V_{dd}$, the switching transistors Tr1 or the like. In the case of overlapping the auxiliary cathode wiring 16 with the data lines $I_{dat}$, a parasitic capacitance may be produced between the data lines $I_{dat}$ and the auxiliary cathode wiring 16, resulting in insufficient data writing to the storage capacitor C. Therefore, the positional relationship with the data lines $I_{dat}$ should be considered when forming the auxiliary cathode wiring 16.

In this exemplary embodiment, one auxiliary cathode wiring 16 and a pair of the scanning lines $V_{sel}$ are laid out alternately in the row direction. In other words, N/2 auxiliary cathode wiring 16 are disposed in such a way that one auxiliary cathode wiring 16 appears every other row. The scanning lines $V_{sel}$ and the auxiliary cathode wiring 16 are produced by simultaneously patterning the metal wiring in the same layer, respectively. The width of one auxiliary cathode wiring 16 is adjusted so as to substantially be equal to the sum of the widths of the pair of the scanning lines $V_{sel}$.

One data line $I_{dat}$ and one power supply line $V_{dd}$ are disposed in every column in the column direction, respectively. The pattern of wiring shown in FIG. 3 illustrates a periodically repeating unit which is applied to all of the pixels 10 in a laminated structure. The layout of wiring in this exemplary embodiment is symmetrical about any line, and the pitches of the pixels in the row direction and column direction are determined uniformly. Each of the switching transistors Tr1 resides at the intersection of the data line $I_{dat}$ and the scanning line $V_{sel}$. The gate terminal of each of the driving transistors Tr2 is oriented in the direction in which the source terminal of the switching transistor Tr1 extends. The drain terminal of the driving transistor Tr2 is connected to each of pixel electrodes 17 through a contact hole h1. The storage capacitors C are formed in the longitudinal direction of the pixel electrode 17 above the power supply lines $V_{dd}$.

Figure 4:
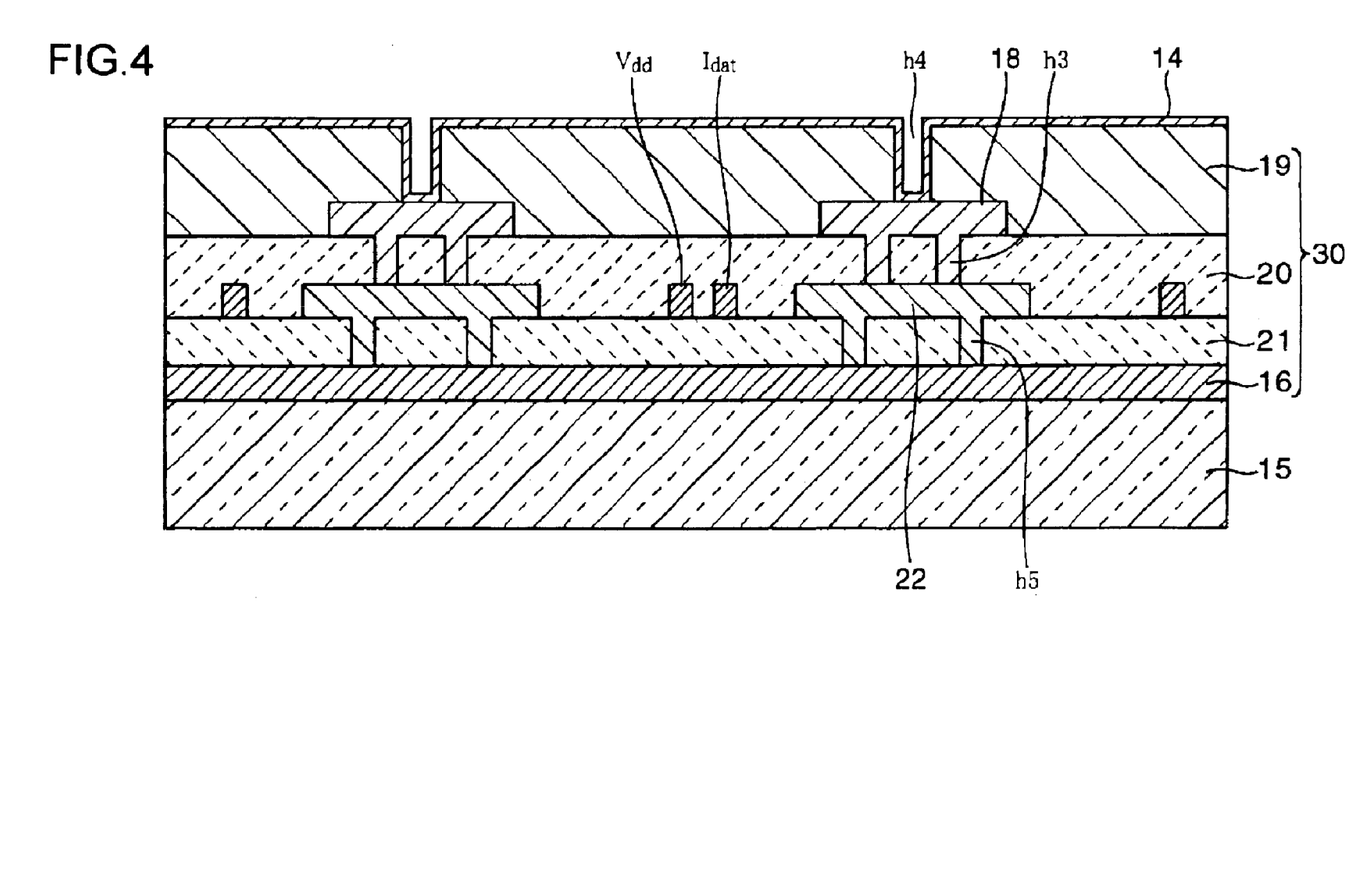
FIG. 4 is a cross-sectional view taken along plane A–A' of FIG. 3.

FIG. 4 is a cross-sectional view taken along plane A–A' of FIG. 3. Referring to FIG. 4, a laminated structure 30 in which the auxiliary cathode wiring 16, an insulating interlayer film 21, source metal layers 22, a planarizing film 20, ITO layers 18, and a bank layer 19 are sequentially laminated is formed in the display area 11 on the substrate 15. The upper surface of the laminated structure 30 is covered with the cathode 14. The insulating interlayer film 21 is a insulating film to electrically separate the data lines $I_{dat}$ and the scanning lines $V_{sel}$ from the auxiliary cathode wiring 16. The islanded source metal layers 22 which are patterned in the same process as the data lines $I_{dat}$ and the scanning lines $V_{sel}$ are formed on the insulating interlayer film 21. The source metal layers 22 are connected to the auxiliary cathode wiring 16 through contact holes h5 formed in the insulating interlayer film 21. The planarized insulating film 20 is formed on the insulating interlayer film 21. The islanded ITO layers 18 are formed by patterning on the planarizing film 20. The ITO layers 18 are connected to the source metal layers 22 through contact holes h3 formed in the planarizing film 20. The contact holes h3 are formed at multiple positions along the direction in which the auxiliary cathode wiring 16 extends. Preparing many joints connecting the ITO layer 18 and the source metal layer 22 allows a reduction in the electrical resistance.

On the other hand, the upper surface of the planarizing film 20 is covered with the bank layer 19, which is made of a photosensitive organic material or the like. The bank layer 19 is a component to partition the pixels 10. Oval openings h2 are opened by a precise alignment so as to position on the pixel electrodes 17 (see FIG. 3). On portions where the surfaces of the pixel electrodes 17 are exposed through the openings h2, positive-hole transporting layers and light-emitting layers are formed sequentially from the lower layer adjacent to the substrate. Additionally, the cathode 14 as a common electrode is formed so as to cover the upper surface of the laminated structure 30 disposed on the display area 11. In this way, light-emitting sections OLED are formed, which include the cathode, the light-emitting layer, the positive-hole transporting layer, and one pixel electrode.

The laminated structure of the device layer constituting the light-emitting section OLED is not limited to the above-described configuration. Other examples of the laminated structure include: a cathode, a light-emitting layer, and a pixel electrode; a cathode, an electron transporting layer, a light-emitting layer, and a pixel electrode; a cathode, an electron transporting layer, a light-emitting layer, a positive-hole transporting layer, and a pixel electrode, for example. In fact, a positive-hole transporting layer and an electron transporting layer are necessarily required and these layers may be added freely. The positive-hole transporting layer may be a triphenylamine derivative (TPD), a hydrazine derivative, or an arylamine derivative. The electron transporting layer may be an aluminum-quinolinol complex ($Alq_3$), a distyrylbiphenyl derivative (DPVBi), an oxadiazole derivative, a bistyrylanthracene derivative, a benzoxazolethiophene derivative, perylenes, or thiazoles. The light-emitting layer is not limited to an organic material and may be made of an inorganic material.

In the surface of the bank layer 19, openings h4, which are aligned precisely at multiple positions communicating to the ITO layers 18, are disposed in the direction in which the auxiliary cathode wiring 16 extends at multiple positions. The cathode 14 covering the bank layer 19 is connected to the ITO layers 18 through the contact holes h4 and is also connected to the auxiliary cathode wiring 16 through the source metal layers 22. In this way, the auxiliary cathode wiring 16 formed in the laminated structure 30 is connected to the cathode 14 so that the electrical resistance decreases and thus sufficient current is supplied to each of the pixels 10.

This exemplary embodiment allows a reduction in the resistance of the cathode 14 and in luminance non-uniformity resulting from non-uniformity of the currents supplied to the pixels 10. Contact areas for the cathode 14 with the cathode power supply lines lie in a frame of the display panel in known panels. According to this exemplary embodiment, such contact is ensured by the laminated structure 30, thus reducing the width of the frame and resulting in a display panel with smaller dead space. Since the bank layer, which is made of the organic material, has low resistance to heat and chemicals, it is difficult to form the auxiliary cathode wiring 16 on the bank layer, but it is easy to form metal wiring such as the auxiliary cathode wiring 16 on the substrate 15 provided with the FET or the like.

Although one auxiliary cathode wiring 16 is disposed every two rows in this exemplary embodiment, it is not limited thereto and the auxiliary cathode wiring 16 may be disposed at any suitable density such as one line every n rows (n is an integer more than two). The position of the auxiliary cathode wiring 16 is not limited to on the substrate 15. For example, it may be in any layer of the laminated structure 30.

[Second Exemplary Embodiment]

Figure 5:
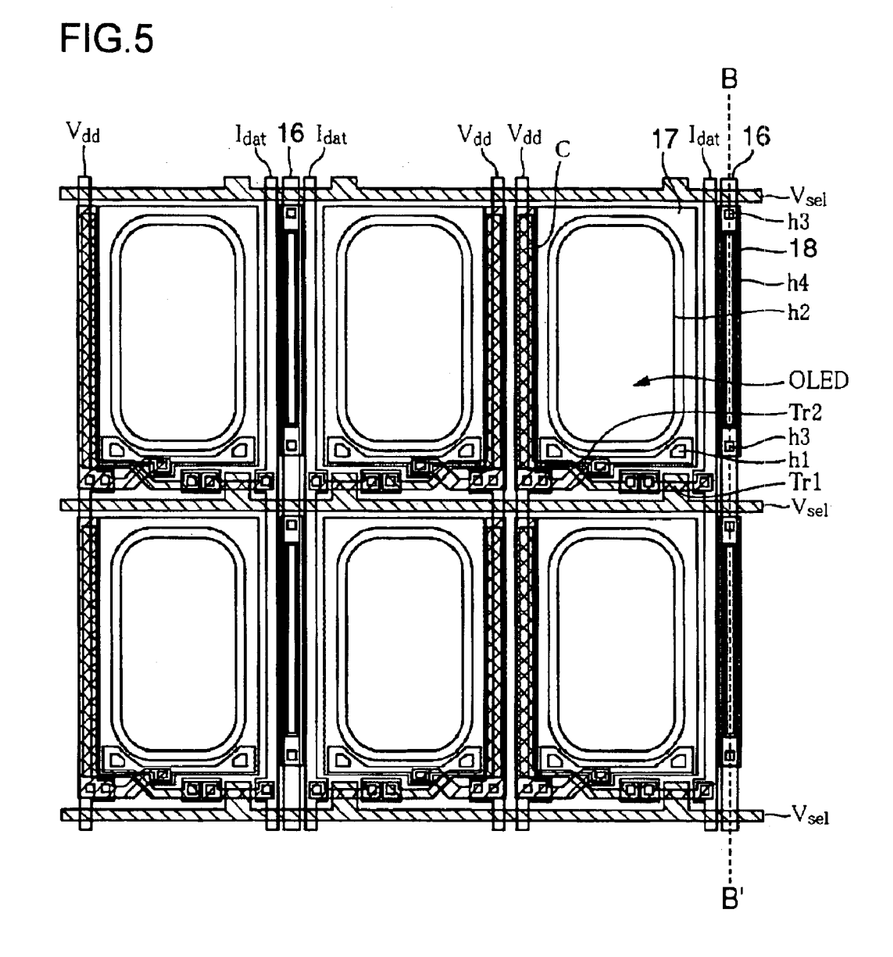
FIG. 5 is a schematic that shows a layout of wiring of the second exemplary embodiment of the present invention.

FIG. 5 shows the layout of wiring in an organic EL display panel 100 according to a second exemplary embodiment of the present invention. This exemplary embodiment differs from the first exemplary embodiment on the point of that auxiliary cathode wiring 16 is disposed in the column direction. Referring to FIG. 5, where one pixel includes three RGB picture elements, three auxiliary cathode wiring 16 are spaced uniformly every two pixels in the column direction. Two data lines $I_{dat}$ are disposed at two sides of each auxiliary cathode wiring 16. Between adjacent auxiliary cathode wiring 16, two power supply lines $V_{dd}$ are formed as a pair. The sum of the widths of the one auxiliary cathode wiring 16 and the two data lines $I_{dat}$ is substantially equal to the sum of the widths of the pair of power supply lines $V_{dd}$. Thereby, the layout of the wiring shown in this figure is arranged so as to have symmetry about any column. On the other hand, in the row direction, one of scanning lines $V_{sel}$ is disposed in each row. Each of switching transistors Tr1 resides at the intersection of the scanning line $V_{sel}$ and one data line $I_{dat}$. The gate terminal of each of driving transistors Tr2 is oriented in the direction in which the source terminal of the switching transistor Tr1 extends. The drain terminal of the driving transistor Tr2 is connected to each of pixel electrodes 17 through each of contact holes h1. The storage capacitors C are formed in the longitudinal direction of the pixel electrode 17 above the power supply lines $V_{dd}$.

Figure 6:
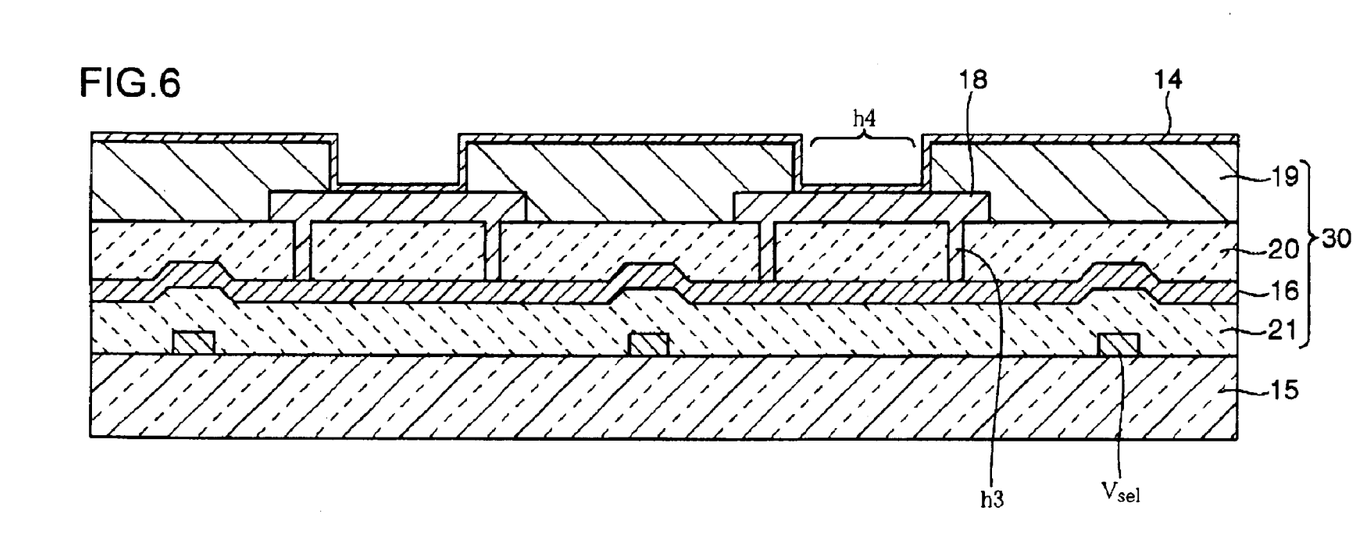
FIG. 6 is a cross-sectional view taken along plane B–B' of FIG. 5.

FIG. 6 is a cross-sectional view taken along plane B–B' of FIG. 5. Referring to FIG. 6, a laminated structure 30 in which the scanning lines $V_{sel}$, an insulating interlayer film 21, the auxiliary cathode wiring 16, a planarizing film 20, ITO layers 18, and a bank layer 19 are sequentially laminated, is formed in the display area 11 on the substrate 15. The upper surface of the laminated structure 30 is covered with the film of the cathode 14. The insulating interlayer film 21 is a film to electrically separate the scanning lines $V_{sel}$ from the auxiliary cathode wiring 16. The linear auxiliary cathode wiring 16 is formed on the insulating interlayer film 21. The ITO layers 18 are islanded by patterning in the direction in which the auxiliary cathode wiring 16 extends at multiple positions and are disposed on the planarizing film 20, which covers the auxiliary cathode wiring 16. Contact holes h3 are formed in the planarizing film 20 so that the ITO layers 18 are connected to the auxiliary cathode wiring 16 through the contact holes h3. The upper surface of the planarizing film 20 is covered with the bank layer 19, which is made of a photosensitive organic material or the like. Oval openings h2 are formed on the pixel electrodes 17 by a precise alignment (see FIG. 5). Like the first exemplary embodiment, light-emitting sections OLED are formed in the openings h2.

On the surface of the bank layer 19, openings h4, which are aligned precisely at multiple positions communicating to the ITO layers 18, are disposed in the direction in which the auxiliary cathode wiring 16 extends. The cathode 14 covering the bank layer 19 is connected to the ITO layers 18 through the contact holes h4 and is also connected to the auxiliary cathode wiring 16. In this way, a plurality of the linear auxiliary cathode wiring 16 formed along the column direction of the pixels 10 are electrically connected to the cathode 14 so that the sufficient current is supplied to each of the pixels 10.

This exemplary embodiment allows, like the first exemplary embodiment, a reduction in the resistance of the cathode 14 and in the luminance non-uniformity resulting from non-uniformity of the currents supplied to the pixels 10. Additionally, contact of the auxiliary cathode wiring 16 with cathode 14 is ensured within the laminated structure 30, thus reducing the width of the frame and resulting in a display panel with smaller dead space. Although one auxiliary cathode wiring 16 is disposed every two columns in this exemplary embodiment, it is not limited thereto and the auxiliary cathode wiring 16 may be disposed at a suitable density, such as one line every n rows (n is an integer more than two).

[Third Exemplary Embodiment]

Figure 7:
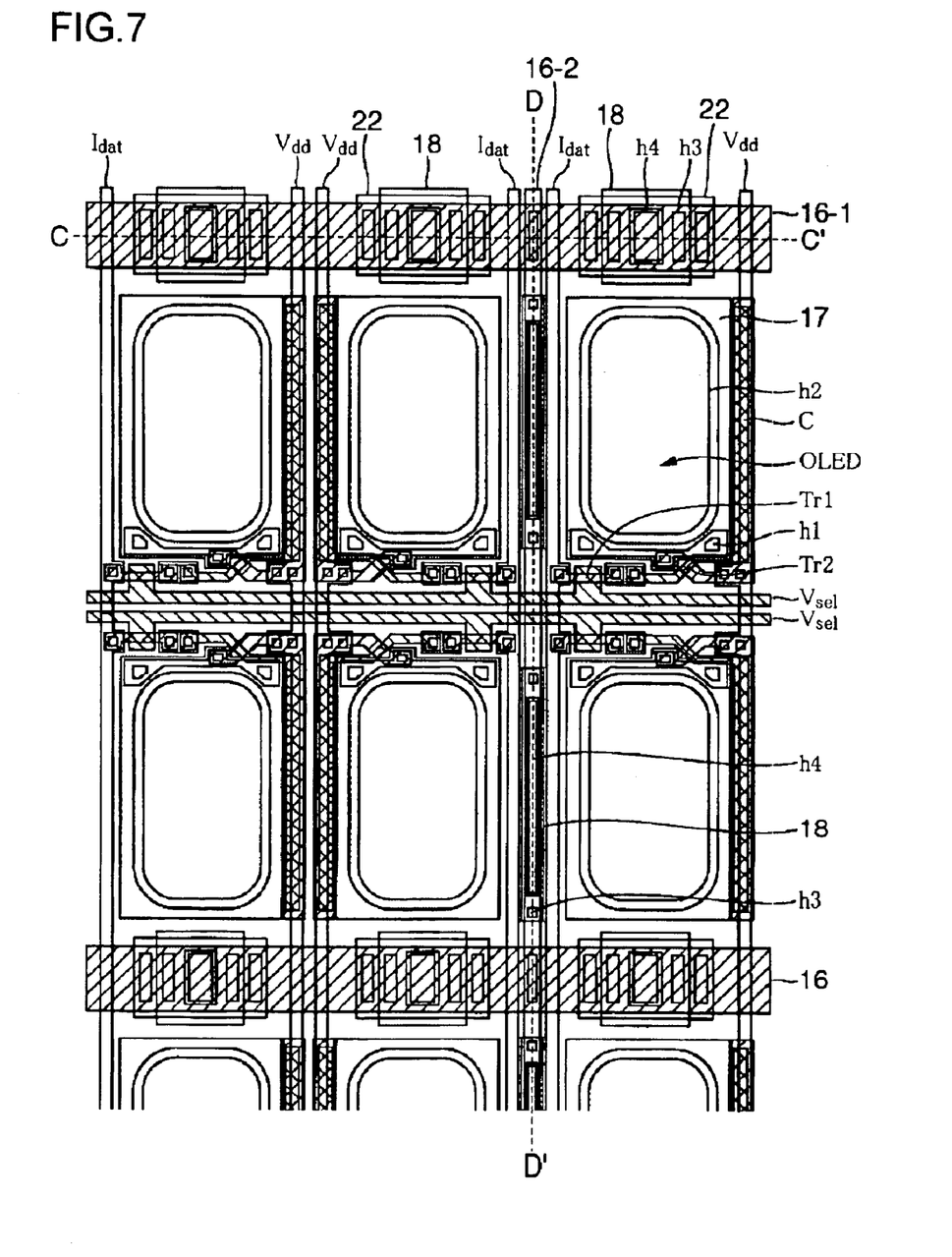
FIG. 7 is a schematic that shows a layout of wiring of the third exemplary embodiment of the present invention.

FIG. 7 shows the layout of wiring in an organic EL display panel 100 according to a third exemplary embodiment of the present invention. This exemplary embodiment differs from the first and second exemplary embodiments on the point of that auxiliary cathode wiring 16 are disposed in both the row and the column directions. For the sake of distinguishing between the auxiliary cathode wiring 16 which are disposed in both the row and the column directions, the auxiliary cathode wiring 16 disposed along the row direction are called first auxiliary cathode wiring 16-1, while the auxiliary cathode wiring 16 disposed along the column direction are called second auxiliary cathode wiring 16-2. When the "auxiliary cathode wiring 16" is simply used, it includes both. Referring to FIG. 7, where one pixel consist of three RGB picture elements, three second auxiliary cathode wiring 16-2 are spaced uniformly every two pixels in the column direction. Two data lines $I_{dat}$ are disposed at two sides of each of the second auxiliary cathode wiring 16-2. Between adjacent second auxiliary cathode wiring 16-2, two power supply lines $V_{dd}$ are formed as a pair. The sum of the widths of one second auxiliary cathode wiring 16-2 and the two data lines $I_{dat}$ is substantially equal to the sum of the widths of the two power supply lines $V_{dd}$. Therefore, the layout of the wiring shown in this figure is arranged so as to have symmetry about any column.

On the other hand, a pair of scanning lines $V_{sel}$ and one first auxiliary cathode wiring 16-1 are laid out alternately in the row direction. The scanning lines $V_{sel}$ and the first auxiliary cathode wiring 16-1 are produced by simultaneously patterning the metal wiring in the same layer, respectively. The width of one first auxiliary cathode wiring 16-1 is adjusted so as to be substantially equal the sum of the widths of the two scanning lines $V_{sel}$. Therefore, the layout of the wiring shown in this figure is arranged so as to have symmetry about any row and column.

Each of switching transistors Tr1 resides at each intersection of the scanning lines $V_{sel}$ and the data lines $I_{dat}$. The gate terminal of each of driving transistors Tr2 is positioned in the direction in which the source terminal of the switching transistor Tr1 extends. The drain terminal of the driving transistor Tr2 is connected to each of pixel electrodes 17 through each of contact holes h1. Above the power supply lines $V_{dd}$, storage capacitors C are formed parallel to the longitudinal direction of the pixel electrode 17.

Figure 8:
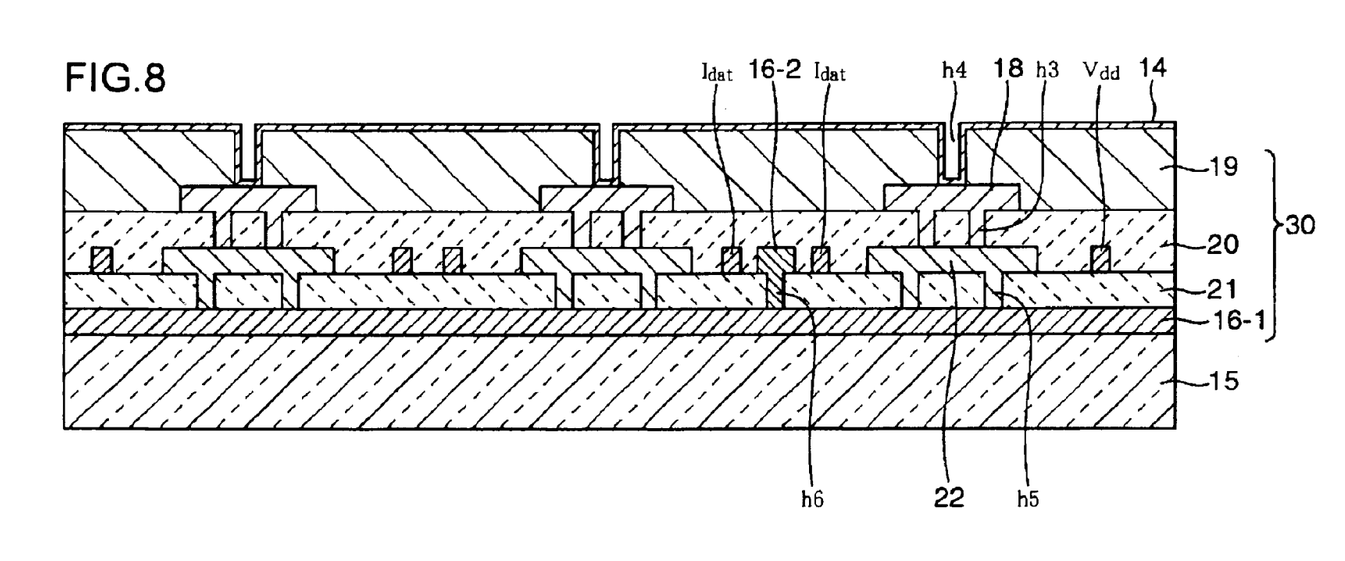
FIG. 8 is a cross-sectional view taken along plane C–C' of FIG. 7.

FIG. 8 is a cross-sectional view taken along plane C–C' of FIG. 7. Referring to FIG. 8, a laminated structure 30 in which the first auxiliary cathode wiring 16-1, insulating interlayer film 21, a planarizing film 20, source metal layers 22, ITO layers 18, and a bank layer 19 are sequentially laminated, is formed on the display area 11 and on the substrate 15. The upper surface of the laminated structure 30 is covered with the film of a cathode 14. The insulating interlayer film 21 is a film to electrically separate the data lines $I_{dat}$ and the power supply lines $V_{dd}$ from the first auxiliary cathode wiring 16-1. In the same layer as the data lines $I_{dat}$ and the power supply lines $V_{dd}$, the second auxiliary cathode wiring 16-2 are disposed in the direction orthogonal to the first auxiliary cathode wiring 16-1. The first auxiliary cathode wiring 16-1 and the second auxiliary cathode wiring 16-2 are electrically connected through contact holes h6 formed in the insulating interlayer film 21.

On the insulating interlayer film films 21, the islanded source metal layers 22 are formed at multiple positions in the same layer as the second auxiliary cathode wiring 16-2 in the direction in which the first auxiliary cathode wiring 16-1 extends.

The source metal layers 22 are connected to the first auxiliary cathode wiring 16-1 through contact holes h5 formed in the insulating interlayer film 21. On the planarizing films 20, the islanded ITO layers 18 are disposed in a direction in which the first auxiliary cathode wiring 16-1 extend at multiple positions and are connected to the source metal layers 22 through contact holes h3. The bank layer 19, which is made of a photosensitive organic material or the like is formed on the planarizing films 20. Oval openings h2 are positioned on the pixel electrode 17 by a precise alignment (see FIG. 7). Like the first exemplary embodiment, light-emitting sections OLED are formed in the openings h2. In the surface of the bank layers 19, contact holes h4, which are aligned precisely at multiple positions communicating to the ITO layers 18, are disposed in the direction in which the second auxiliary cathode wiring 16-2 extend. The cathode 14 formed on the bank layers 19 is connected to the auxiliary cathode wiring 16 in the laminated structure 30 so that the electrical resistance decreases and thus sufficient current is supplied to each of the pixels 10.

Figure 9:
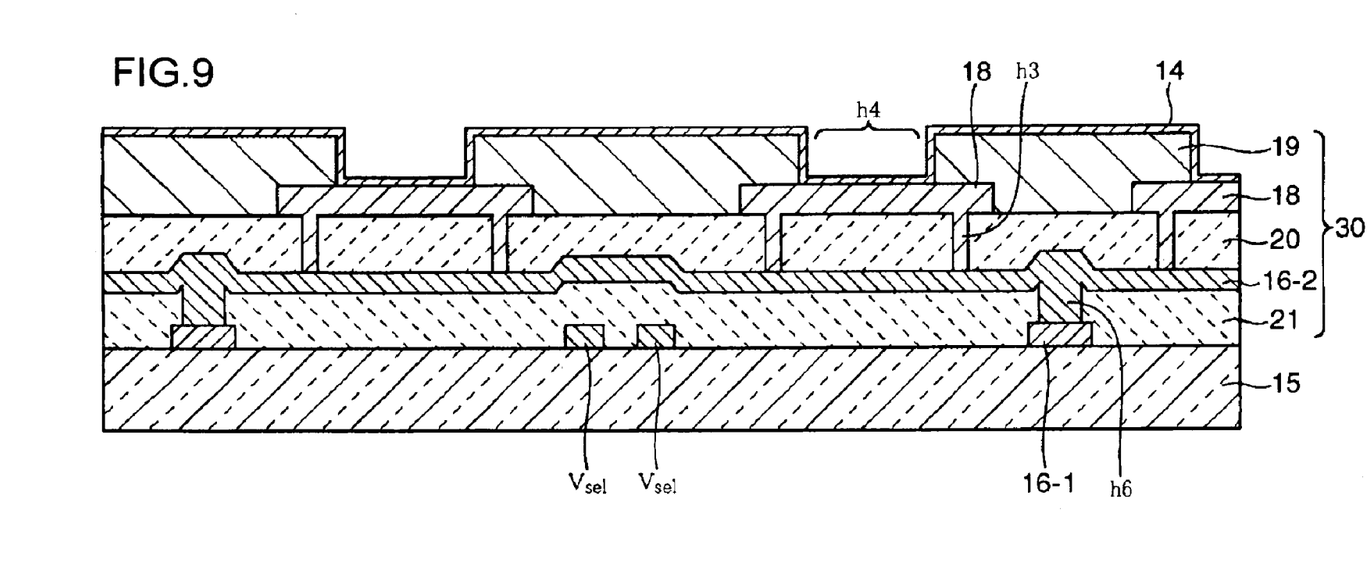
FIG. 9 is a cross-sectional view taken along plane D–D' of FIG. 7.

FIG. 9 is a cross-sectional view taken along plane D-D' of FIG. 7. Referring to FIG. 9, the laminated structure 30 in which the first auxiliary cathode wiring 16-1, the scanning lines $V_{sel}$, the insulating interlayer film 21, the second auxiliary cathode wiring 16-2, the planarizing film 20, the ITO layers 18, and the bank layers 19 are sequentially laminated, is formed on the substrate 15. The first auxiliary cathode wiring 16-1 and the second auxiliary cathode wiring 16-2 are orthogonally disposed with sandwiching the insulating interlayer film 21 therebetween and are connected to each other through contact holes h6 formed in the insulating interlayer film 21. The islanded ITO layers 18 are disposed on the planarizing films 20, which are laminated on the second auxiliary cathode wiring 16-2, in the direction in which the second auxiliary cathode wiring 16-2 extends. The ITO layers 18 are connected to the second auxiliary cathode wiring 16-2 through the contact holes h3 formed in the planarizing films 20. The contact holes h4 are formed in the bank layer 19 at multiple positions in the direction in which the second auxiliary cathode wiring 16-2 extends, thereby connecting the cathode 14 with the ITO layers 18. In this way, the cathode 14 is connected to the auxiliary cathode wiring 16, which are formed by orthogonal lines, in the laminated structure 30 so that the resistance of the cathode 14 is greatly reduced and thus sufficient electrical power is supplied to each of the pixels 10. Therefore, the luminance non-uniformity resulting from non-uniformity of the currents supplied to the pixels 10 is reduced, achieving enhanced or excellent display performance. Additionally, contact of the auxiliary cathode wiring 16 with the cathode 14 is ensured within the laminated structure 30, thus reducing the width of the frame and resulting in a display panel with smaller dead space.

[Fourth Exemplary Embodiment]

Figure 10A:
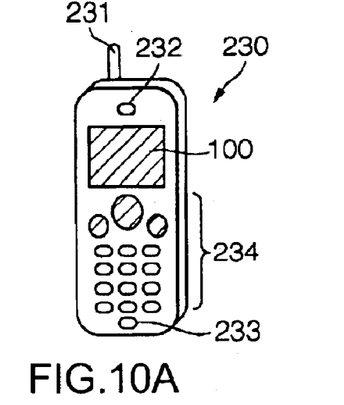
FIGS. 10A–10F are schematics that show exemplary applications of the organic EL display panel of the present invention.
Figure 10B:
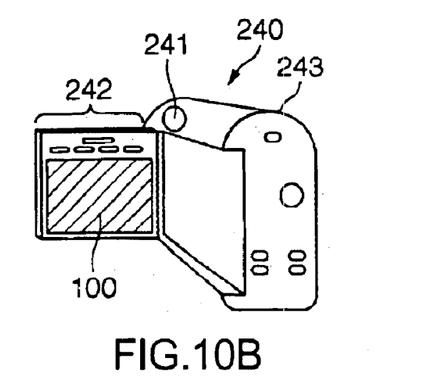
Figure 10C:
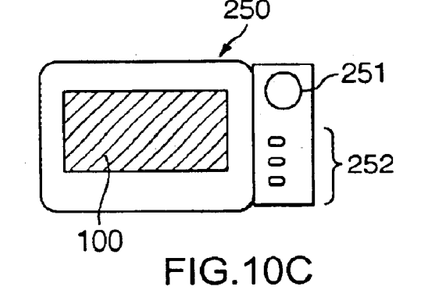

FIGS. 10A–10F show examples of electronic units to which the electro-optical apparatus of the present invention is applicable. FIG. 10A shows an application to a mobile phone. A mobile phone 230 includes an antenna 231, a sound-output section 232, a sound-input section 233, an operating section 234, and the organic EL display panel 100 of the present invention. The organic EL display panel 100 is usable as a display of the mobile phone 230. FIG. 10B shows an application to a video camera. A video camera 240 includes a picture-receiving section 241, an operating section 242, a sound-input section 243, and the organic EL display panel 100 of the present invention. The organic EL display panel 100 is usable as a viewfinder or a display. FIG. 10C shows an application to a mobile personal computer. A computer 250 includes a camera 251, an operating section 252, and the organic EL display panel 100 of the present invention. The organic EL display panel 100 of the present invention is usable as a display apparatus.

Figure 10D:
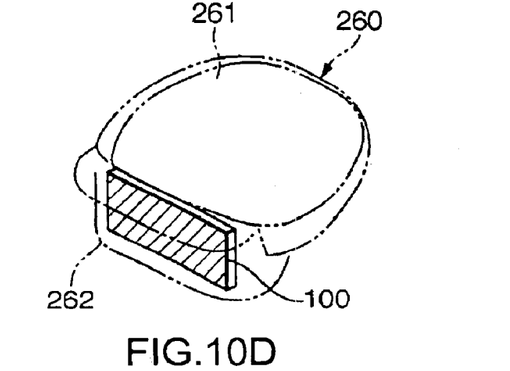
Figure 10E:
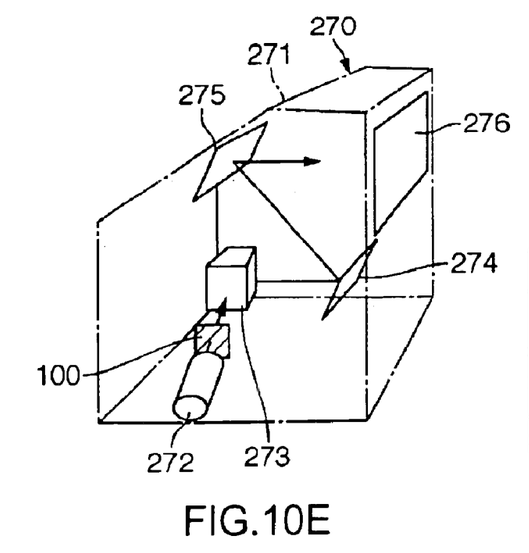
Figure 10F:
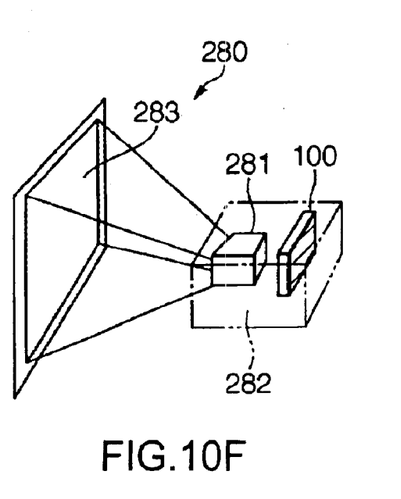

FIG. 10D shows an application to a head-mounted display. A head-mounted display 260 includes a band 261, an optical device holder 262, and the organic EL display panel 100 of the present invention. The organic EL display panel 100 is usable as a source of displaying images. FIG. 10E shows an application to a rear-type projector. A projector 270 includes a case 271, a light source 272, a combining optical system 273, a mirror 274, a mirror 275, a screen 276, and the organic EL display panel 100 of the present invention. FIG. 10F shows an application to a front-type projector. A projector 280 includes a case 282, an optical system 281, and the organic EL display panel 100 of the present invention. Images can be displayed on a screen 283. Thus, the organic EL display panel 100 of the present invention is usable as a source of displaying images.

What is claimed is:

1. An electro-optical apparatus, comprising:
   electro-optical devices having a laminated structure including a substrate having a viewing area, first electrode layers formed on or above the viewing area of the substrate, and a second electrode layer formed on or above the first electrode layers, the laminated structure further including:
   first power lines to supply a voltage to the first electrode layers, and
   second power lines electrically connected to the second electrode layer, the first power lines and the second power lines being arranged on or above the viewing area, and being arranged in the same layer as the first electrode layers or below the first electrode layers.

2. The electro-optical apparatus according to claim 1, the first power lines and the second power lines being at least partially disposed in the same layer.

3. The electro-optical apparatus according to claim 2, the second electrode layer functioning as a cathode for the electro-optical devices.

4. The electro-optical apparatus according to claim 3, the second power lines functioning as auxiliary cathode lines.

5. The electro-optical apparatus according to claim 1, the second electrode layer having light transmission.

6. The electro-optical apparatus according to claim 1, the second power lines being formed linearly in any layer of the laminated structure at a predetermined density.

7. The electro-optical apparatus according to claim 1, the second power lines and the second electrode layer being formed in different layers of the laminated structure, and being electrically connected to each other within the laminated structure.

8. The electro-optical apparatus according to claim 7, positions where the second power lines are electrically connected to the second electrode layer being disposed along the direction in which the second power lines extend at multiple positions.

9. The electro-optical apparatus according to claim 7, the second power lines and the second electrode layer being formed in different layers with an insulating interlayer film disposed therebetween, and being electrically connected to each other through contact holes formed in the insulating interlayer film.

10. The electro-optical apparatus according to claim 1, the electro-optical devices being arranged in two substantially orthogonal directions, and
   the second power lines being arranged in a direction substantially parallel to either direction of the two orthogonal directions in which the electro-optical devices are arranged.

11. The electro-optical apparatus according to claim 10, the second power lines being disposed at substantially equal pitch.

12. The electro-optical apparatus according to claim 1, the electro-optical devices being electroluminescent devices.

13. An electronic unit, comprising:
   the electro-optical apparatus according to claim 1.

14. A matrix substrate to form electro-optical devices having a laminated structure that includes first electrode layers and a second electrode layer, the matrix substrate comprising:

a substrate, the first electrode layers formed on or above the substrate;

first power lines to supply a voltage to the first electrode layers; and second power lines electrically connected to the second electrode layer to be formed on or above the first electrode layers, both of the first power lines and the second power lines being arranged on or above a viewing area, and being arranged in the same layer as the first electrode layers or below the first electrode layers.

15. The matrix substrate according to claim 14, the first power lines and the second power lines being at least partially disposed in the same layer.

16. The matrix substrate according to claim 14, the second electrode layer functioning as a cathode for the electro-optical devices.

17. The matrix substrate according to claim 16, the second power lines functioning as auxiliary cathode wiring.

18. The matrix substrate according to claim 14, the second electrode layer having light transmission.

19. The matrix substrate according to claim 14, the second power lines being formed linearly in any layer of the laminated structure at a predetermined density.

20. The matrix substrate according to claim 14, the second power lines and the second electrode layer being formed in different layers of the laminated structure, and being electrically connected to each other within the laminated structure.

21. The matrix substrate according to claim 20, positions where the second power lines are electrically connected to the second electrode layer being disposed along the direction in which the second power lines extend at multiple positions.

22. The matrix substrate according to claim 20, the second power lines and the second electrode layer being formed in different layers with an insulating interlayer film disposed therebetween, and the second power lines and the second electrode layer being electrically connected to each other through contact holes formed in the insulating interlayer film.

23. The matrix substrate according to claim 14, the electro-optical devices being arranged in two substantially orthogonal directions, and the second power lines being arranged in a direction substantially along the direction in which either direction of the two orthogonal directions in which the electro-optical devices are arranged.

24. The matrix substrate according to claim 23, the second power lines being disposed at substantially equal pitch.

* * * * *